United States Patent
Wu et al.

(10) Patent No.: US 10,811,332 B2
(45) Date of Patent: Oct. 20, 2020

(54) THERMAL-DISSIPATING SUBSTRATE STRUCTURE

(71) Applicant: TDK TAIWAN CORP., Taoyuan (TW)

(72) Inventors: Ming-Hung Wu, Taoyuan (TW); Chi-Fu Wu, Taoyuan (TW); An-Ping Tseng, Taoyuan (TW); Hao-Yu Wu, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 0 days.

(21) Appl. No.: 16/176,971

(22) Filed: Oct. 31, 2018

(65) Prior Publication Data
US 2019/0139854 A1 May 9, 2019

Related U.S. Application Data

(60) Provisional application No. 62/582,591, filed on Nov. 7, 2017.

(30) Foreign Application Priority Data

Sep. 12, 2018 (CN) .................... 2018 2 1488958 U

(51) Int. Cl.
*H01L 23/367* (2006.01)
*H01L 23/373* (2006.01)
*H01L 23/498* (2006.01)
*H01L 23/532* (2006.01)
*H01L 23/538* (2006.01)

(52) U.S. Cl.
CPC ........ *H01L 23/367* (2013.01); *H01L 23/3677* (2013.01); *H01L 23/3735* (2013.01); *H01L 23/49822* (2013.01); *H01L 23/5389* (2013.01); *H01L 23/53209* (2013.01); *H01L 23/53295* (2013.01); *H01L 2224/18* (2013.01)

(58) Field of Classification Search
None
See application file for complete search history.

(56) References Cited

FOREIGN PATENT DOCUMENTS

| JP | 2006253168 A | 9/2006 |
|---|---|---|
| JP | 2008091471 A | 4/2008 |
| JP | 2010129877 A | 6/2010 |

*Primary Examiner* — Long Pham
(74) *Attorney, Agent, or Firm* — Muncy, Geissler, Olds & Lowe, P.C.

(57) ABSTRACT

A substrate structure is provided, including a substrate, an integrated circuit chip, a circuit structure, and a thermal-dissipating structure. The integrated circuit chip is disposed in the substrate. The circuit structure is electrically connected to the integrated circuit chip. The thermal-dissipating structure is disposed in the substrate and adjacent to the integrated circuit chip, and the thermal-dissipating structure is electrically isolated from the circuit structure.

16 Claims, 6 Drawing Sheets

THERMAL-DISSIPATING SUBSTRATE STRUCTURE

CROSS REFERENCE TO RELATED APPLICATIONS

This application claims the benefit of U.S. Provisional Application No. 62/582,591, filed Nov. 7, 2017, and claims priority of China Patent Application No. 201821488958.X, filed Sep. 12, 2018, the entirety of which are incorporated by reference herein.

BACKGROUND

Technical Field

The disclosure relates to a substrate structure, and in particular to a substrate structure with a thermal-dissipating structure, which is disposed close to an integrated circuit chip.

Description of the Related Art

With the development of technology, electronic products have been used more and more widely. Especially, cell phones have gradually become the center of modern people's lives. In recent years, major cell phone manufacturers have conducted research and development on rapid charging techniques. Recently, such techniques have been introduced for use with cell phones. However, the size of the substrate inside the cell phones is a limiting factor, and so battery capacity cannot be increased without affecting the functionality of the cell phones.

In addition, when in use, a current may pass through the rapid charging module or the power management module of a cell phone that is larger than the current that passes through other portions of the cell phone. As the high current passes through, both the integrated circuit (IC) chip itself and the surrounding passive components are heat sources. Therefore, when cell phones are charged, or an operation that consumes a lot of energy is performed, a thermal-generation issue may occur.

BRIEF SUMMARY

For solving the aforementioned problems, the present disclosure provides a substrate structure. The substrate structure includes a substrate, an integrated circuit chip, a circuit structure, and a thermal-dissipating structure. The integrated circuit chip is disposed in the substrate. The circuit structure is electrically connected to the integrated circuit chip. The thermal-dissipating structure is disposed in the substrate and adjacent to the integrated circuit chip, and the thermal-dissipating structure is electrically isolated from the circuit structure.

In an embodiment, the integrated circuit chip further has a first surface, a second surface, and at least one contact, wherein the second surface is opposite to the first surface, the contact is located on the first surface, and the circuit structure is connected to the contact. The second surface faces the thermal-dissipating structure. As viewed along a direction perpendicular to the first surface, the integrated circuit chip at least partially overlaps the thermal-dissipating structure. The substrate structure further includes a first insulating layer and a second insulating layer, wherein the substrate is located between the first insulating layer and the second insulating layer. The second surface faces the second insulating layer, and the thermal-dissipating structure penetrates the second insulating layer. The thermal-dissipating structure further includes a plurality of thermal conductive components. The contact includes a power contact and a signal contact, and the degree of intensity of the thermal conductive components near the power contact is greater than the degree of intensity of the thermal conductive components near the signal contact.

In an embodiment, the thermal-dissipating structure further includes a thermal conductive component and a thermal-dissipating member, and the thermal-dissipating member has a plurality of protruding portions on its surface. The substrate structure further includes another thermal-dissipating structure, wherein the first surface faces the other thermal-dissipating structure. The substrate structure further includes a metal thermal conductive board, wherein the metal thermal conductive board is disposed in the substrate, and is located between the second surface and the thermal-dissipating structure.

In an embodiment, the substrate structure further includes a third insulating layer and a metal thermal conductive board, wherein the third insulating layer is located between the second insulating layer and the metal thermal conductive board, and the metal thermal conductive board is in contact with the third insulating layer and the thermal-dissipating structure simultaneously. The substrate structure further includes a passive component and an insulating material layer, wherein the passive component is disposed on the first insulating layer, and the insulating material layer is wrapped around the passive component. A groove is formed in the second insulating layer and the substrate, and the thermal-dissipating structure is disposed in the groove.

In an embodiment, the substrate structure further includes a metal thermal conductive board disposed on the substrate, wherein the metal thermal conductive board is in contact with the substrate and the thermal-dissipating structure simultaneously. The substrate structure further includes a thermal-dissipating member, wherein the metal thermal conductive board is located between the thermal-dissipating structure and the thermal-dissipating member. The thermal-dissipating structure has a first cross-section and a second cross-section, the first cross-section is located between the integrated circuit chip and the second cross-section, and an area of the first cross-section is smaller than an area of the second cross-section. A portion of the substrate is clamped between the thermal-dissipating structure and the integrated circuit chip.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

The substrate structures of some embodiments of the present disclosure are described in the following description. However, it should be appreciated that the following detailed description of some embodiments of the disclosure provides various concepts of the present disclosure which may be performed in specific backgrounds that can vary widely. The specific embodiments disclosed are provided merely to clearly describe the usage of the present disclosure by some specific methods without limiting the scope of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

Figure 1:
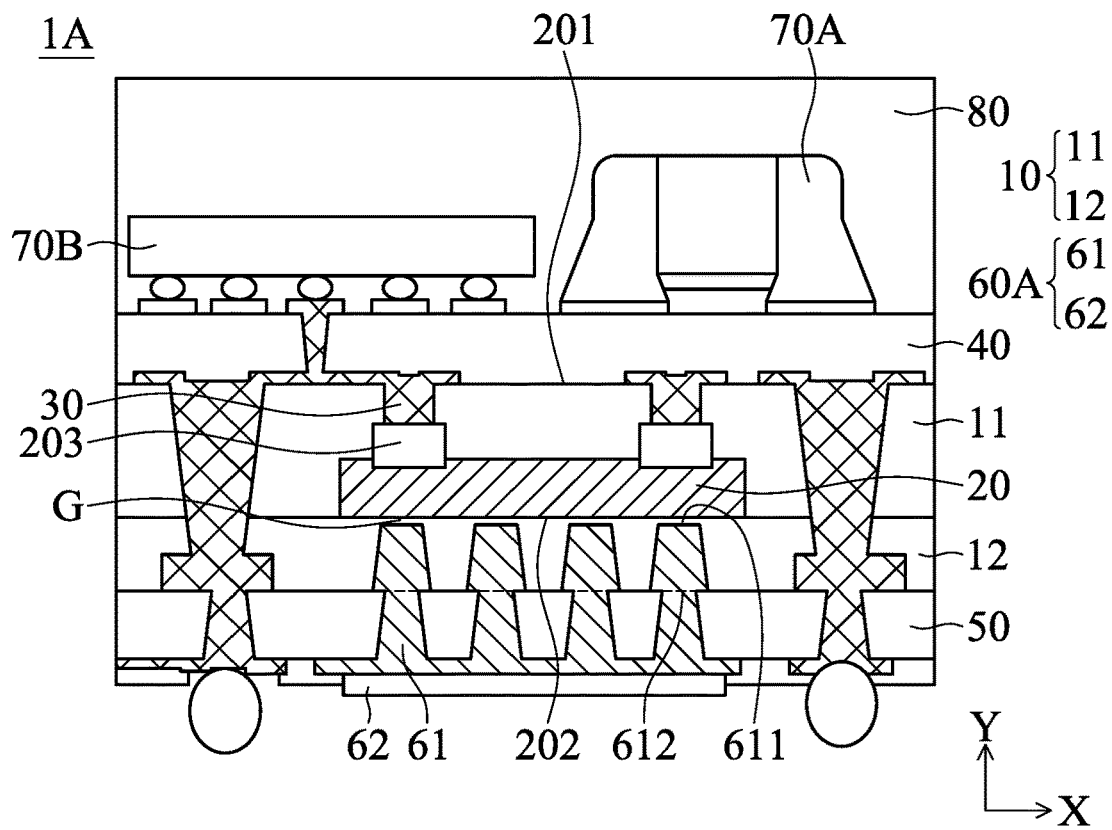
FIG. 1 is a cross-sectional view illustrating a substrate structure in accordance with an embodiment of the present disclosure.

Refer to FIG. 1, which is a cross-sectional view illustrating a substrate structure 1A in accordance with an embodiment of the present disclosure. In this embodiment, the substrate structure 1A mainly includes a substrate 10, an integrated circuit chip 20, a circuit structure 30, a first insulating layer 40, a second insulating layer 50, and a thermal-dissipating structure 60A. The integrated circuit chip 20 is disposed in the substrate 10, wherein the substrate 10 includes an upper portion 11 and a lower portion 12. For example, the integrated circuit chip 20 is disposed on the lower portion 12, and the upper portion 11 is further disposed on the integrated circuit chip 20. Finally, the upper portion 11 and the lower portion 12 are combined in a manner of press heating, and thereby the integrated circuit chip 20 is disposed in the substrate 10. In the following embodiments, the upper portion 11 and the lower portion 12 are jointly illustrated as the substrate 10. The integrated circuit chip 20 has a first surface 201, a second surface 202, and at least one contacts 203, wherein the second surface 202 is opposite to the first surface 201 (namely, the first surface 201 and the second surface 202 are respectively located on opposite sides of the integrated circuit chip 20), and the contacts 203 are located on the first surface 201. The circuit structure 30 is electrically connected to the contacts 203 of the integrated circuit chip 20. The first insulating layer 40 and the second insulating layer 50 are respectively disposed on an upper side and a lower side of the substrate 10. That is, the substrate 10 is located between the first insulating layer 40 and the second insulating layer 50, wherein the first surface 201 faces the first insulating layer 40, and the second surface 202 faces the second insulating layer 50. It should be noted that the material of the substrate 10 may be a material with lower hardness, and thereby the integrated circuit chip 20 disposed in the substrate 10 may be protected. For example, the hardness of the material of the substrate 10 may be lower than the hardness of the material of the first insulating layer 40 and/or the second insulating layer 50.

Although only one integrated circuit chip 20 is illustrated in the embodiments of the present disclosure, however, in some other embodiments, multiple integrated circuit chips 20 may be disposed in the substrate 10, and the integrated circuit chips 20 may be arranged along a vertical direction (Y-axis direction) or a horizontal direction (X-axis direction). In addition, in some other embodiments, multiple integrated circuit chips 20 may also be arranged in the substrate 10 in an irregular manner.

The thermal-dissipating structure 60A is disposed in the substrate 10, and penetrates the second insulating layer 50, wherein the second surface 202 of the integrated circuit chip 20 faces the thermal-dissipating structure 60A. In this embodiment, the thermal-dissipating structure 60A includes a plurality of thermal conductive components 61, which are close to the integrated circuit chip 20. For example, as shown in FIG. 1, after performing laser drilling on the substrate 10 in a direction towards the second surface 202, metal materials (materials with high thermal conductivity, such as copper) are filled therein. Then, laser drilling is performed on the second insulating layer 50, and metal materials are filled therein to form the thermal conductive components 61. The diameter of the holes formed by laser drilling may gradually increase outward. In other words, on the top of the thermal conductive components 61 of the thermal-dissipating structure 60A, there is a first cross-section 611 (namely, the top surfaces of the thermal conductive components 61) parallel to X-axis direction, and there is a second cross-section 612 (shown as the dotted lines in FIG. 1), which is parallel to X-axis direction, at an interface of the substrate 10 and the second insulating layer 50. The first cross-section 611 is located between the integrated circuit chip 20 and the second cross-section 612 (namely, the first cross-section 611 is closer to the integrated circuit chip 20 than the second cross-section 612), and the area of the first cross-section 611 is smaller than the area of the second cross-section 612.

When the laser drilling process is performed, if the holes are too close to the integrated circuit chip 20, or even exposing the integrated circuit chip 20, the integrated circuit chip 20 may be damaged. Therefore, in some embodiments, a portion of the substrate 10 usually remains between the thermal-dissipating structure 60A, which is filled into the holes, and the integrated circuit chip 20 to avoid the damage of the integrated circuit chip 20. That is, there is a gap G between the thermal-dissipating structure 60A and the integrated circuit chip 20. Certainly, in some other embodiments, the thermal-dissipating structure 60A may also directly contact the integrated circuit chip 20, facilitating to enhance the thermal-dissipation effect of the thermal-dissipating structure 60A. Basically, the thermal-dissipating structure 60A and the circuit structure 30 are electrically isolated from each other. That is, except for grounding, the thermal-dissipating structure 60A and the circuit structure 30 are not electrically connected. In addition, as viewed from a direction (Y-axis direction) perpendicular to the first surface 201, the integrated circuit chip 20 and the thermal-dissipating structure 60A at least partially overlap.

Furthermore, the thermal-dissipating structure 60A may selectively include a thermal conductive material layer 62, wherein the thermal conductive material layer 62 is disposed on exposed surfaces of the thermal conductive components 61. In other words, the thermal conductive components 61 are located between the thermal conductive material layer 62 and the integrated circuit chip 20. In addition, various treatments (such as surface roughening, arranging protrusions, arranging recesses, or arranging a metal substrate) may be performed on the surface of the thermal conductive material layer 62 according to the demands of the design. Therefore, the contact area between the thermal-dissipating structure 60A and the external environment is increased such that thermal-dissipating efficiency is enhanced.

Moreover, passive components 70A, 70B (such as a resistor, a capacitor, an inductor) and an insulating material layer 80 may be selectively disposed in the substrate structure 1A, wherein the passive components 70A and 70B are disposed on the first insulating layer 40, and are electrically connected to the integrated circuit chip 20 via the circuit structure 30. The insulating material layer 80 is formed on the first insulating layer 40 in a manner of insert molding, and is wrapped around the passive components 70A and 70B. For example, the insulating material layer 80 is a material with a thermal conductivity higher than that of air (such as epoxy), and the thermal conductivity of the insulating material layer 80 may be higher than other insulating layers (such as the first insulating layer 40 and the second insulating layer 50). Therefore, the thermal-dissipating efficiency of the substrate structure 1A may be enhanced further.

It should be noted that compared to recent semiconductor package structure on the market (wherein the integrated circuit chip is disposed on the surface of the substrate), the substrate structure in the aforementioned embodiment (wherein the integrated circuit chip 20 is disposed in the substrate 10) may reduce the size of the overall package structure by 40% or more. The space that is saved on the surface of the substrate structure may be used for arranging other electronic components. Meanwhile, since the integrated circuit chip 20 is disposed in the substrate 10, the circuit connected to the integrated circuit chip 20 is also wrapped in the substrate 10. Therefore, the circuit is less likely to be damaged, and failure may be avoided. In addition, because the thermal conductivity of the substrate 10, which is wrapped around the integrated circuit chip 20, is higher than the thermal conductivity of air, the above substrate structure may also enhance the thermal-dissipation effect.

Figure 2:
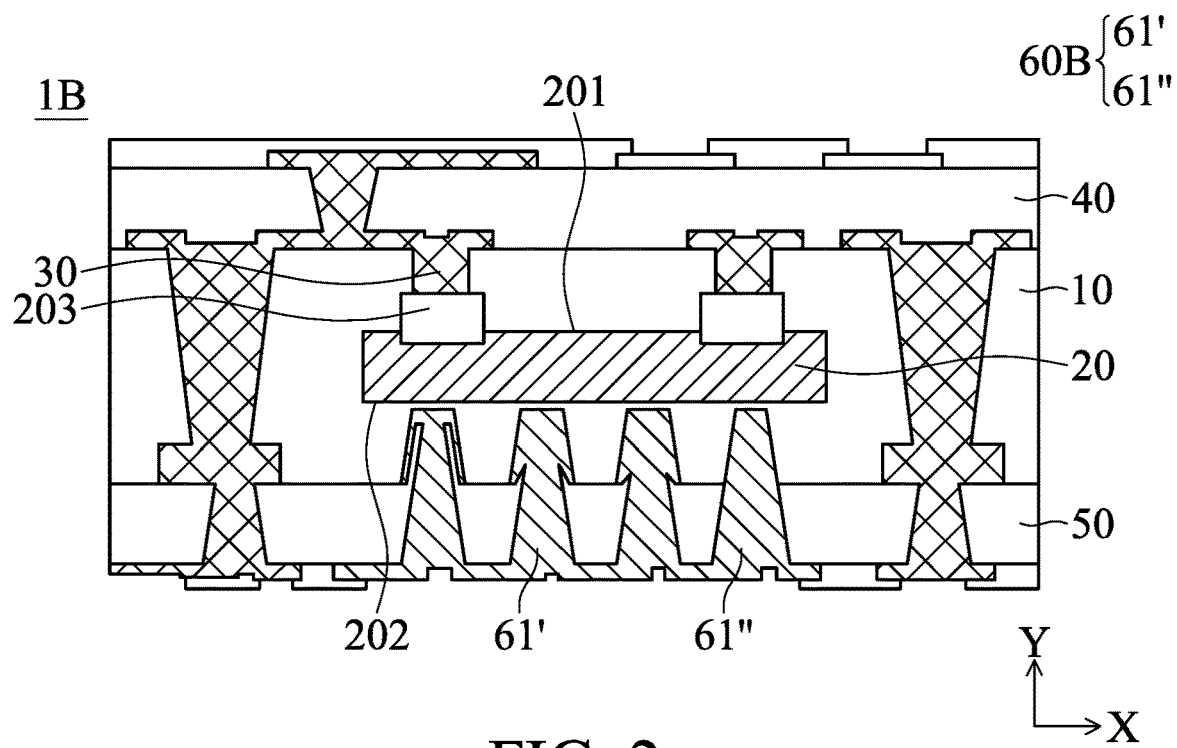
FIG. 2 is a cross-sectional view illustrating the substrate structure in accordance with another embodiment of the present disclosure.

Next, refer to FIG. 2, which is a cross-sectional view illustrating the substrate structure 1B in accordance with another embodiment of the present disclosure. It should be noted that the substrate structure 1B may include the same or similar elements as the substrate structure 1A, those same or similar elements will be denoted using the same or similar numerals, and will not be described in detail again. The main difference between the substrate structure 1B and the substrate structure 1A is that as shown in FIG. 2, a thermal-dissipating structure 60B of the substrate structure 1B includes thermal conductive components 61' and 61" with different shapes, wherein a surface, which is an interface between the integrated circuit chip 20 and the second insulating layer 50, of the thermal conductive component 61' is designed to tilt relative to the horizontal direction (X-axis direction). That is, there is an angle between the surface of the thermal conductive component 61' and the horizontal direction. Therefore, the surface area of the thermal conductive component 61' is increased, and the thermal-dissipating efficiency is enhanced. In addition, the thermal conductive component 61" is formed in the holes, which are formed by a single laser drilling process performed on the substrate 10 and the second insulating layer 50. Therefore, relevant processes may be simplified, and the cost may be reduced. It should be understood that although thermal conductive components with different shapes are illustrated in FIG. 2, the substrate structure 1B may merely include a single type of thermal conductive components (such as one of the thermal conductive components 61' and 61"), or a combination of the thermal conductive components.

It should be noted that although the thermal conductive material layer 62 is not illustrated in the thermal-dissipating structure 60B in FIG. 2, however, the thermal conductive material layer 62 may be disposed on exposed surfaces of the thermal conductive components 61' and 61" according to practical needs. In other words, the thermal conductive components 61' and 61" are located between the thermal conductive material layer 62 and the integrated circuit chip 20, and thereby the thermal-dissipation effect may be enhanced further.

Figure 3:
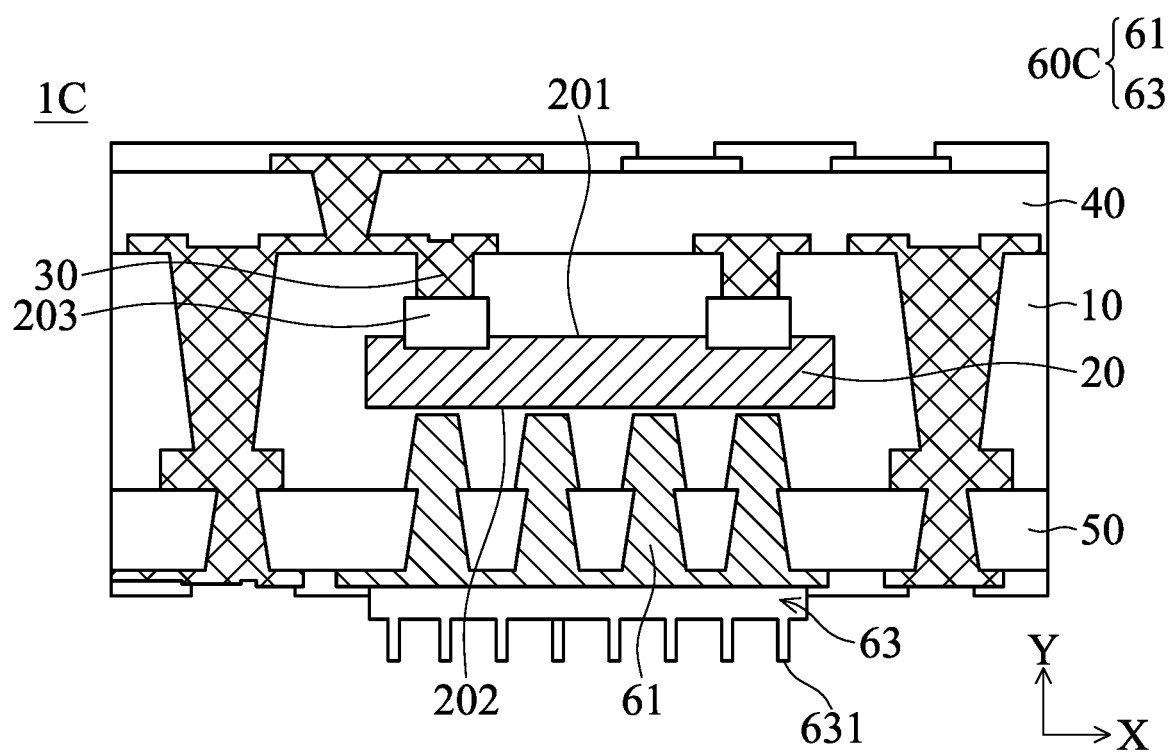
FIG. 3 is a cross-sectional view illustrating the substrate structure in accordance with another embodiment of the present disclosure.

FIG. 3 is a cross-sectional view illustrating the substrate structure 1C in accordance with another embodiment of the present disclosure. It should be noted that the substrate structure 1C may include the same or similar elements as the substrate structure 1A, those same or similar elements will be denoted with the same or similar numerals, and will not be described in detail again. The main difference between the substrate structure 1C and the substrate structure 1A is that the thermal-dissipating structure 60C of the substrate structure 1C further includes a thermal-dissipating member 63, wherein the thermal-dissipating member 63 is located below the thermal conductive components 61 (namely, located on the exposed surfaces of the thermal conductive components 61). In other words, the thermal conductive components 61 are located between the substrate 10 and the thermal-dissipating member 63. For example, the thermal-dissipating member 63 may be a material with high thermal conductivity (i.e. a material with a thermal conductivity higher than that of air), such as Ag, carbon nanotube (CNT), graphene, or a combination thereof. In addition, the thermal-dissipating member 63 has a plurality of protruding portions 631 on its lower surface (i.e. opposite to a surface facing the thermal conductive components 61). The arrangement of the protruding portions 631 helps increase the surface area, which is exposed to the external environment, of the thermal-dissipating member 63, and the thermal-dissipation effect may be enhanced further.

It should be understood that both the thermal conductive material layer 62 and the thermal-dissipating member 63 are disposed on the exposed surfaces of the thermal conductive components 61, 61' or 61", and the thermal conductive material layer 62 and the thermal-dissipating member 63 have the effect of enhancing the thermal-dissipation effect. Generally, the space occupied by the thermal conductive material layer 62 is smaller, meaning that the thermal conductive material layer 62 is suitable for the design with space demands. The arrangement of the thermal-dissipating member 63 is simpler, so that the process may be simplified, and a larger thermal-dissipating surface area may be provided. In the course of manufacturing various substrate structures discussed in the present disclosure, the thermal conductive material layer 62 or the thermal-dissipating member 63 may be selectively disposed according to practical needs. In other words, although only the thermal conductive material layer 62 or the thermal-dissipating member 63 may be illustrated in all of the embodiments of the present disclosure, or none of them are illustrated, however, the embodiments should be understood as including one of the thermal conductive material layer 62 and the thermal-dissipating member 63. The description regarding the selection or substitution of the thermal conductive material layer 62 and the thermal-dissipating member 63 will not be repeated in the following paragraphs.

Figure 4:
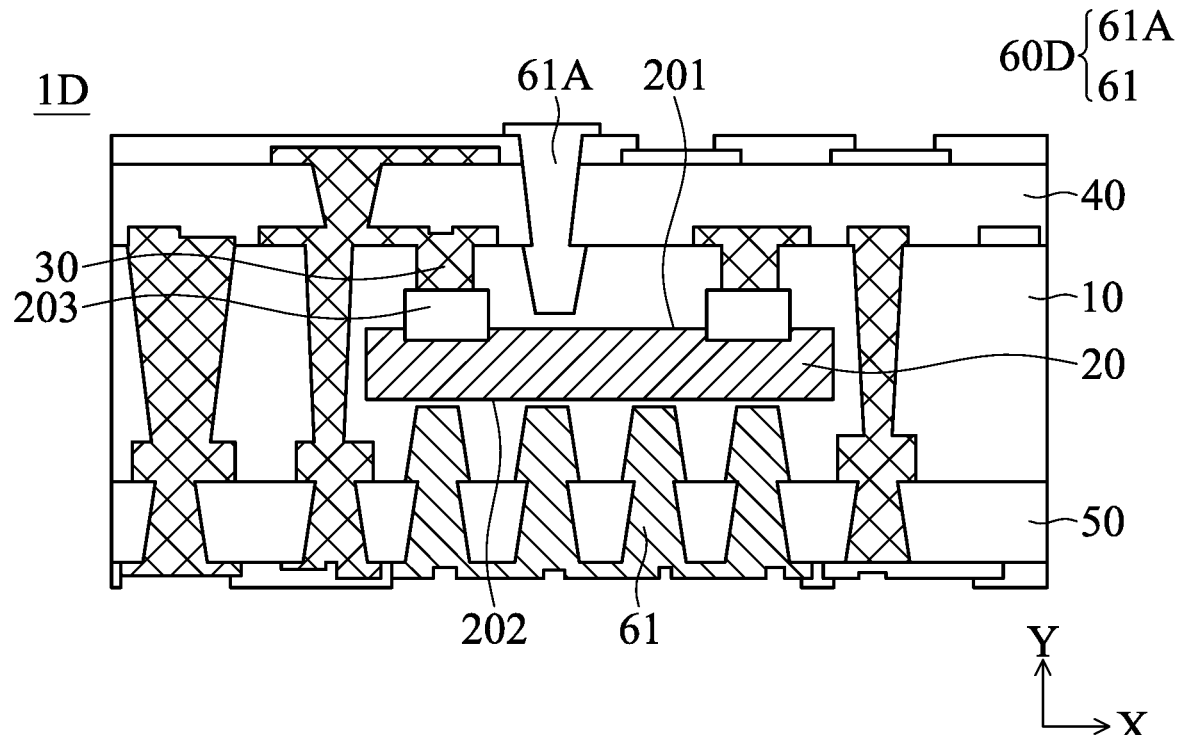
FIG. 4 is a cross-sectional view illustrating the substrate structure in accordance with another embodiment of the present disclosure.

FIG. 4 is a cross-sectional view illustrating the substrate structure 1D in accordance with another embodiment of the present disclosure. It should be noted that the substrate structure 1D may include the same or similar elements as the substrate structure 1A, those same or similar elements will be denoted with the same or similar numerals, and will not be described in detail again. The main difference between the substrate structure 1D and the substrate structure 1A is that the thermal-dissipating structure 60D further includes at least one thermal conductive component 61A disposed on the first surface 201 of the integrated circuit chip 20. In other words, the first surface 201 faces the thermal conductive component 61A. Since the thermal conductive components 61 and 61A are respectively disposed on the second surface 202 and the first surface 201 of the integrated circuit chip 20, the thermal-dissipation may be enhanced further. In some embodiments, besides being arranged on the upper and lower sides of the integrated circuit chip 20, the thermal conductive components 61 and 61A may also be disposed around the integrated circuit chip 20.

Figure 5:
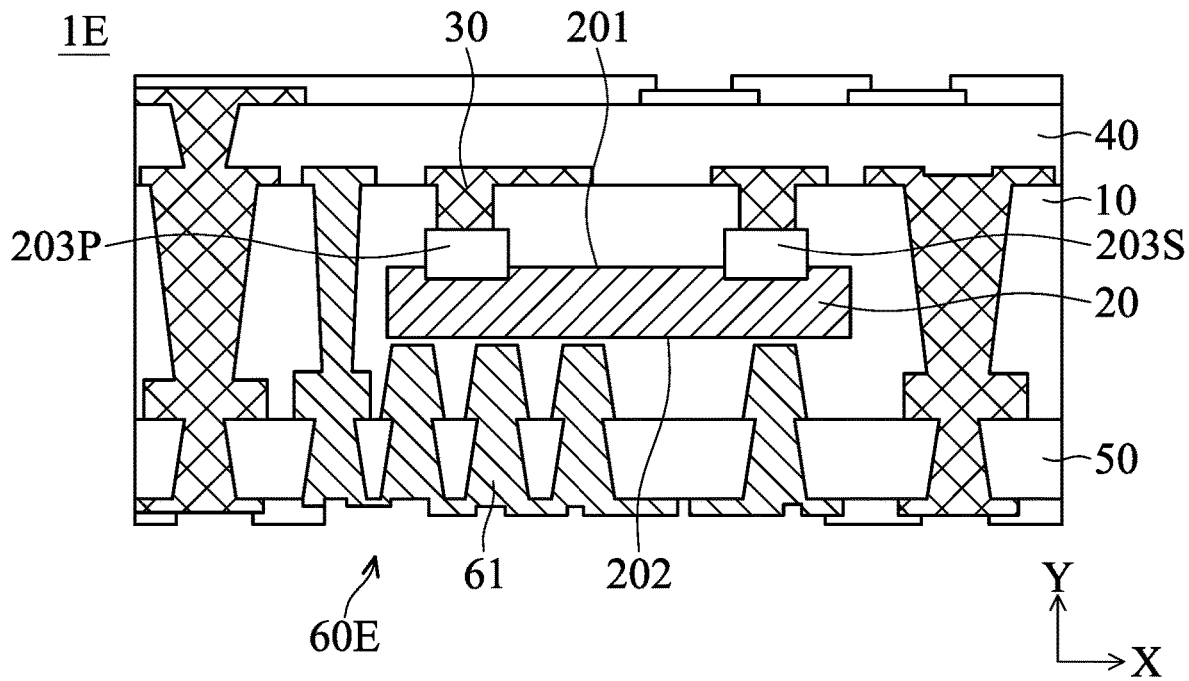
FIG. 5 is a cross-sectional view illustrating the substrate structure in accordance with another embodiment of the present disclosure.

FIG. 5 is a cross-sectional view illustrating the substrate structure 1E in accordance with another embodiment of the present disclosure. It should be noted that the substrate structure 1E may include the same or similar elements as the substrate structure 1A, those same or similar elements will be denoted with the same or similar numerals, and will not be described in detail again. The main difference between the substrate structure 1E and the substrate structure 1A is that the contacts 203 of the integrated circuit chip 20 include a power contact 203P and a signal contact 203S. In this embodiment, the substrate structure 1E further includes a re-distribution layer (not shown), which is configured to concentrate the power supply circuits and connect them to the power contact 203P of the integrated circuit chip 20. The signal contact 203S is configured to transmit signals. Since the power contact 203P is electrically connected to a power source, larger current may pass through the power contact 203P than the signal contact 203S. Therefore, heat source may be generated around the power contact 203P more easily. In order to enhance thermal-dissipation of the region around the power contact 203P, as shown in FIG. 5, the degree of intensity of the thermal conductive components 61 close to the power contact 203P is increased. In other words, the degree of intensity of the thermal conductive components 61 close to the power contact 203P is greater than the degree of intensity of the thermal conductive components 61 close to the signal contact 203S. By the design of concentrating the thermal conductive components 61 in a specific region, thermal-dissipating efficiency may be partially enhanced in the region.

Figure 6:
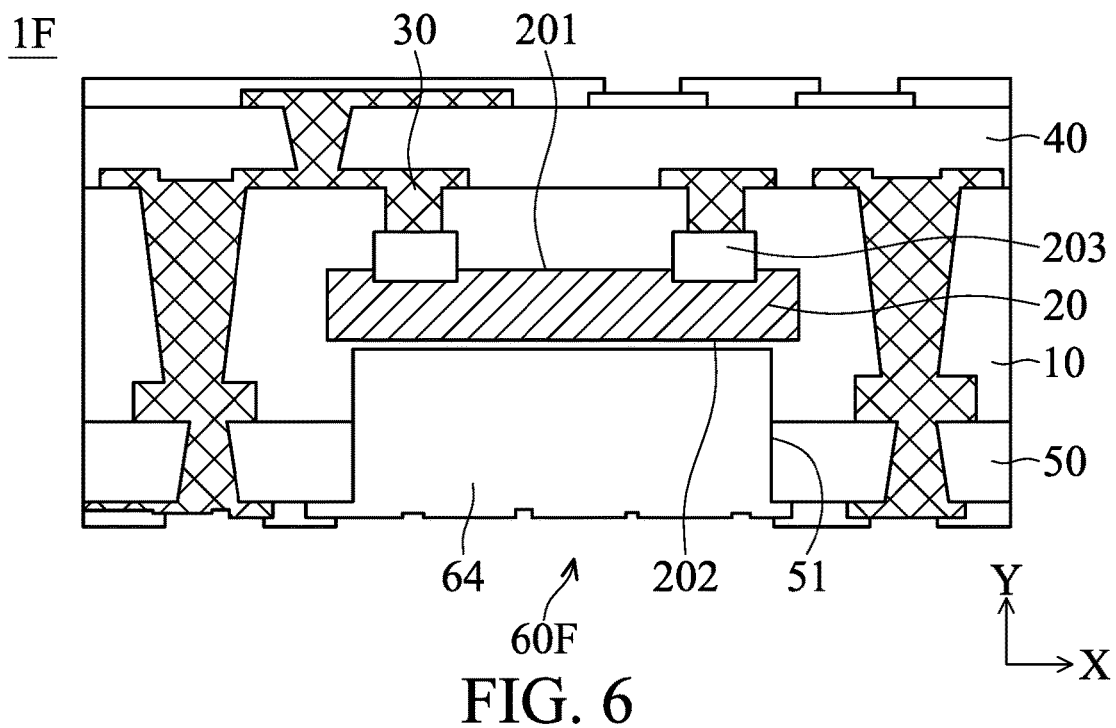
FIG. 6 is a cross-sectional view illustrating the substrate structure in accordance with another embodiment of the present disclosure.

FIG. 6 is a cross-sectional view illustrating the substrate structure 1F in accordance with another embodiment of the present disclosure. It should be noted that the substrate structure 1F may include the same or similar elements as the substrate structure 1A, those same or similar elements will be denoted using the same or similar numerals, and will not be described in detail again. The main difference between the substrate structure 1F and the substrate structure 1A is that a groove 51 is formed in the second insulating layer 50 and the substrate 10, and the thermal-dissipating structure 60F includes a thermal conductive component 64. The thermal conductive component 64 is disposed in the groove 51, wherein the thermal conductive component 64 is formed in the groove 51 in a manner of electroplating. Compared to the thermal-dissipating structure with multiple thermal conductive components 61, 61' or 61", the integrated thermal-dissipating structure 60F may further enhance thermal conduction efficiency.

Figure 7:
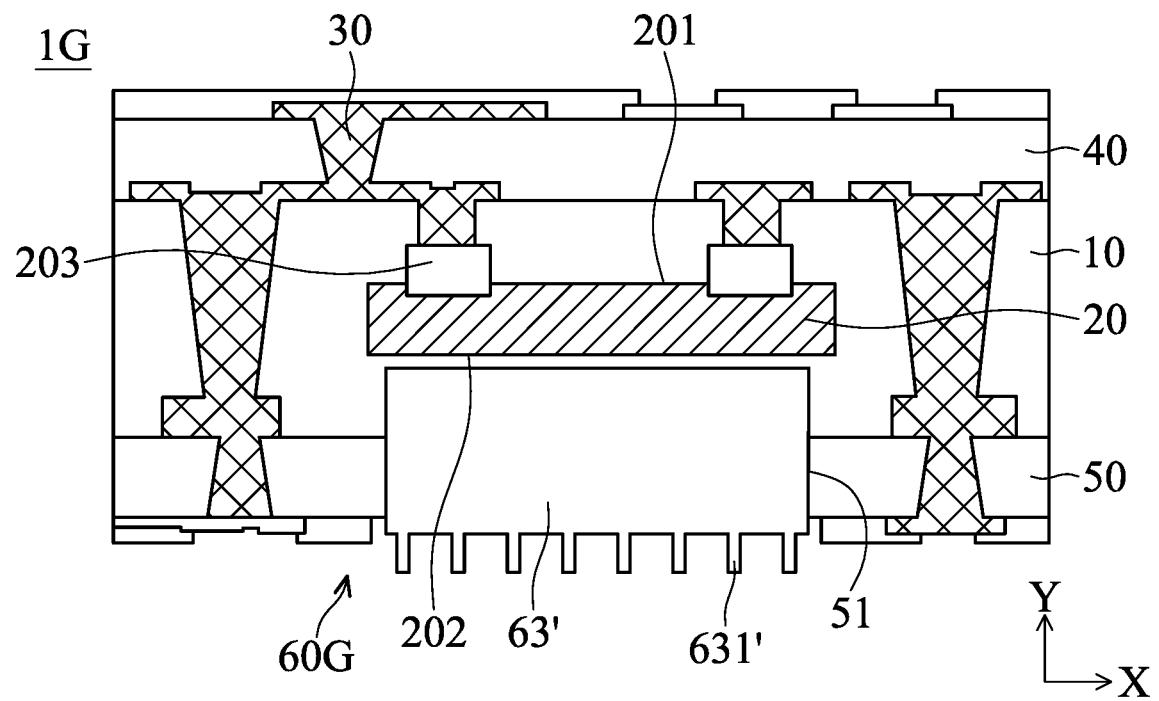
FIG. 7 is a cross-sectional view illustrating the substrate structure in accordance with another embodiment of the present disclosure.

FIG. 7 is a cross-sectional view illustrating the substrate structure 1G in accordance with another embodiment of the present disclosure. It should be noted that the substrate structure 1G may include the same or similar elements as the substrate structure 1F, those same or similar elements will be denoted using the same or similar numerals, and will not be described in detail again. The main difference between the substrate structure 1G and the substrate structure 1F is that a thermal-dissipating member 63' is disposed in the groove 51, and a plurality of protruding portions 631' may be formed on a lower surface of the thermal-dissipating member 63' (i.e. opposite to a surface facing the thermal conductive components 61), such that the surface area, which faces the external environment, of the thermal-dissipating member 63' may be increased, and thereby the thermal-dissipation effect is enhanced further.

Figure 8:
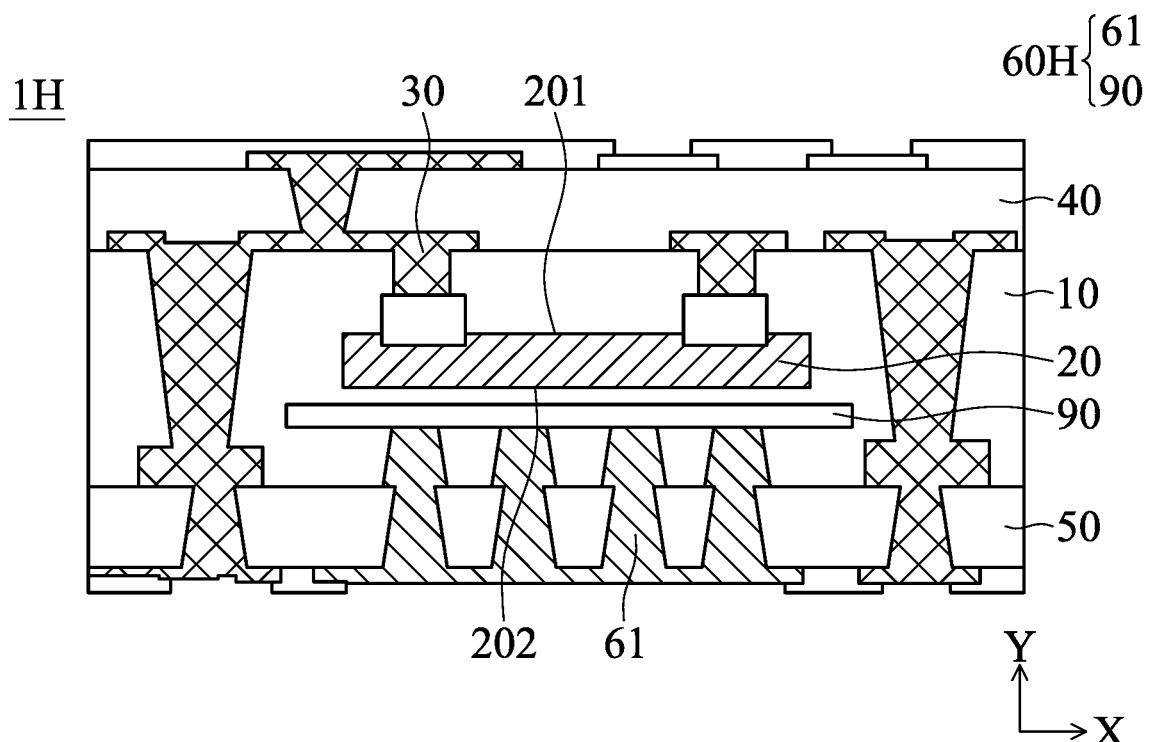
FIG. 8 is a cross-sectional view illustrating the substrate structure in accordance with another embodiment of the present disclosure.

FIG. 8 is a cross-sectional view illustrating the substrate structure 1H in accordance with another embodiment of the present disclosure. It should be noted that the substrate structure 1H may include the same or similar elements as the substrate structure 1A, those same or similar elements will be denoted using the same or similar numerals, and will not be described in detail again. The main difference between the substrate structure 1H and the substrate structure 1A is that the thermal-dissipating structure 60H of the substrate structure 1H further includes a metal thermal conductive board 90 disposed in the substrate 10. The metal thermal conductive board 90 has a plane facing the second surface 202, and the metal thermal conductive board 90 is located between the second surface 202 and the thermal conductive components 61. In some embodiments, the thermal conductive components 61 may directly contact the metal thermal conductive board 90. The metal thermal conductive board 90 may absorb the heat emitted by the integrated circuit chip 20, and the heat is conducted to the external portion by the thermal conductive components 61. Therefore, the arrangement of the metal thermal conductive board 90 helps dissipate the heat more evenly and rapidly.

Figure 9:
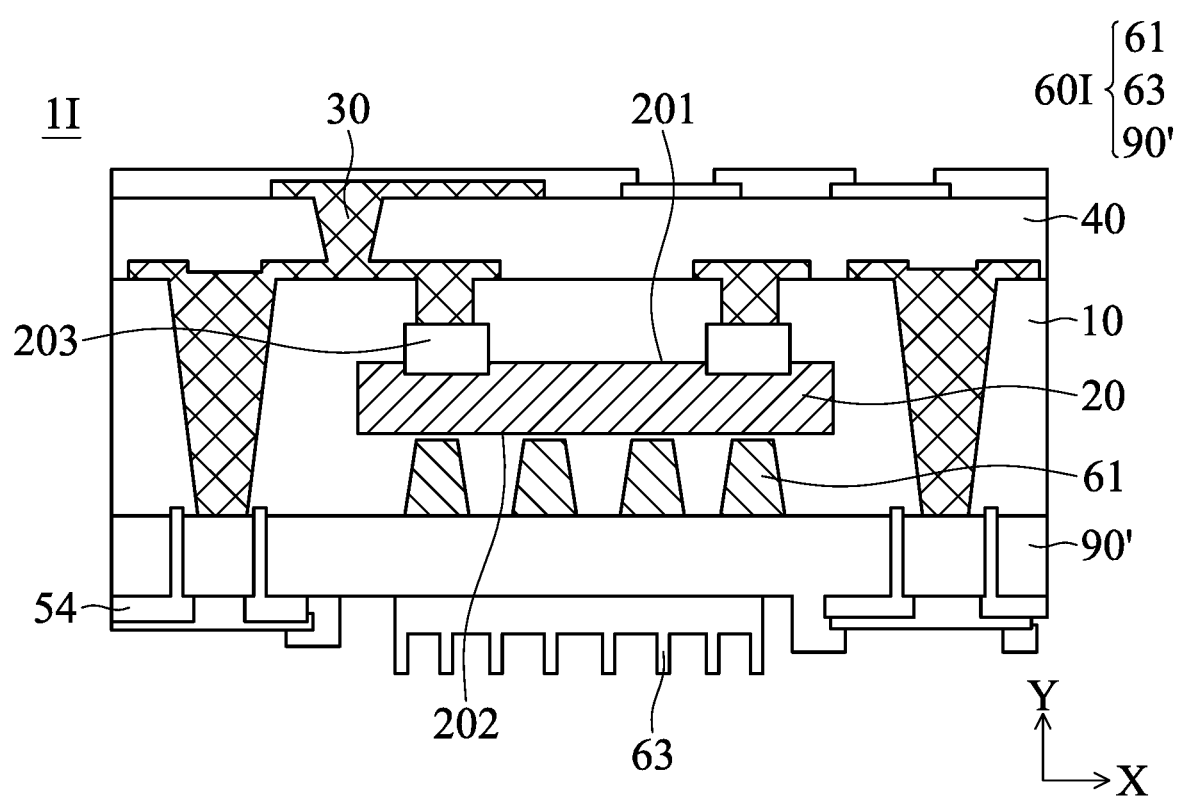
FIG. 9 is a cross-sectional view illustrating the substrate structure in accordance with another embodiment of the present disclosure.

FIG. 9 is a cross-sectional view illustrating the substrate structure 1I in accordance with another embodiment of the present disclosure. It should be noted that the substrate structure 1I may include the same or similar elements as the substrate structure 1A, those same or similar elements will be denoted with the same or similar numerals, and will not be described in detail again. The main difference between the substrate structure 1I and the substrate structure 1A is that the thermal-dissipating structure 60I of the substrate structure 1I further includes the metal thermal conductive board 90' disposed on the substrate 10, wherein the metal thermal conductive board 90' is in contact with the substrate 10 and the thermal-dissipating structure 60I simultaneously. In this embodiment, the second insulating layer 50 is replaced by the metal thermal conductive board 90'. Besides the thermal-dissipation effect, the metal thermal conductive board 90' may also enhance the strength of the substrate structure 1I at the same time. In addition, the thermal-dissipating member 63 may also be selectively disposed below the metal thermal conductive board 90'. In other words, the metal thermal conductive board 90' is located between the thermal-dissipating structure 60I and the thermal-dissipating member 63.

It should be noted that the substrate structure 1I further includes an insulating layer 54 configured to electrically insulate the circuit structure 30 from the metal thermal conductive board 90' to avoid the electrical connection between the circuit structure 30 and the thermal-dissipating structure 60I. The insulating layer 54 may include air or any other suitable insulating material.

Although the passive components 70A, 70B, and the insulating material layer 80 are not illustrated in FIGS. 2 to 9, however, it should be understood that the passive components 70A, 70B, and/or the insulating material layer 80 may be selectively disposed on the aforementioned substrate structures according to practical needs. In addition, even if no passive component is disposed on the substrate structure (such as on the first insulating layer 40), the insulating material layer 80 may still be disposed on the first insulating layer 40 in any suitable manner (such as insert molding). Since the thermal conductivity of the insulating material layer 80 is much higher than that of air, the arrangement of the insulating material layer 80 may facilitate to enhance thermal-dissipation effect.

Figure 10:
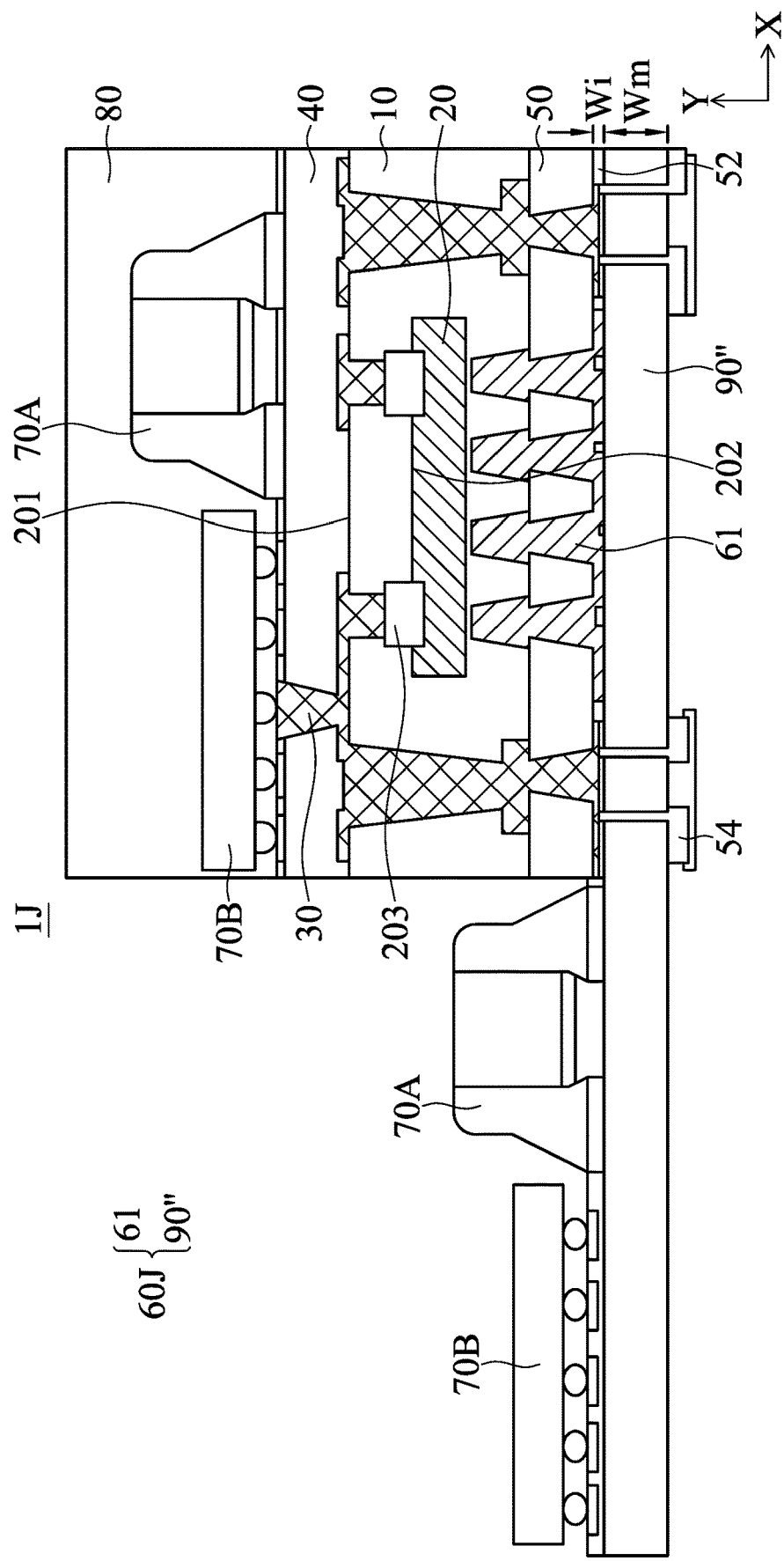
FIG. 10 is a cross-sectional view illustrating the substrate structure in accordance with another embodiment of the present disclosure.

FIG. 10 is a cross-sectional view illustrating the substrate structure 1J in accordance with another embodiment of the present disclosure. It should be noted that the substrate structure 1J may include the same or similar elements as the substrate structure 1A, those same or similar elements will be denoted using the same or similar numerals, and will not be described in detail again. The main difference between the substrate structure 1J and the substrate structure 1A is that the substrate structure 1J further includes a third insulating layer 52 and the metal thermal conductive board 90", both of which are disposed below the second insulating layer 50. The third insulating layer 52 is located between the second insulating layer 50 and the metal thermal conductive board 90", and the metal thermal conductive board 90" is in contact with the third insulating layer 52 and the thermal-dissipating structure 60J simultaneously. In addition, the passive components 70A and 70B may also be disposed on the metal thermal conductive board 90", and thereby it helps enhance the thermal-dissipation effect of the passive components 70A and 70B. It should be noted that the circuit structure 30 and the passive components 70A, 70B have to be electrically insulated from the metal thermal conductive board 90".

In this embodiment, the third insulating layer 52 has a thickness Wi in a direction (Y-axis direction) perpendicular to the first surface 201, and the metal thermal conductive board 90" has another thickness Wm in the same direction. The thickness Wm of the metal thermal conductive board 90" is greater than the thickness Wi of the third insulating layer 52. That way, the mechanical strength and flatness of the substrate structure 1J may be enhanced.

As set forth above, the present disclosure provides a substrate structure with a thermal-dissipating structure, which is disposed close to an integrated circuit chip. By arranging the aforementioned substrate structures, it may help to enhance the thermal-dissipation effect of the electronic components (such as an integrated circuit chip) inside the substrate structure. It should be appreciated that various thermal-dissipating structures discussed in the present disclosure may be replaced, adjusted or combined according to practical needs, and they are not limited by the structure discussed in single embodiment.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

Although the preferable embodiments of the present disclosure have been described above, these embodiments are not intended to limit the present disclosure. Those skilled in the art may make some changes and alterations without departing from the spirit and scope of the present disclosure. Therefore, the scope of the present disclosure may be defined according to the appended claims. Furthermore, each of the appended claims constructs an individual embodiment, and the scope of the present disclosure also includes every combination of the appended claims and embodiments.

What is claimed is:

1. A substrate structure, comprising:
    a substrate;
    an integrated circuit chip disposed in the substrate, wherein the integrated circuit chip further has a first surface, a second surface, and at least one contact, the second surface is opposite to the first surface, and the at least one contact is located on the first surface;
    a circuit structure electrically connected to the integrated circuit chip, wherein the circuit structure is connected to the at least one contact; and
    a thermal-dissipating structure disposed in the substrate and adjacent to the integrated circuit chip, wherein the thermal-dissipating structure is electrically isolated from the circuit structure, wherein the second surface faces the thermal-dissipating structure, and the thermal-dissipating structure further comprises a plurality of thermal conductive components;
    a first insulating layer; and
    a second insulating layer, wherein the substrate is located between the first insulating layer and the second insulating layer, the second surface faces the second insulating layer, and the thermal-dissipating structure penetrates the second insulating layer.

2. The substrate structure as claimed in claim 1, wherein as viewed along a direction perpendicular to the first surface, the integrated circuit chip at least partially overlaps the thermal-dissipating structure.

3. The substrate structure as claimed in claim 1, wherein the at least one contact comprises a power contact and a signal contact, and a degree of intensity of the thermal conductive components near the power contact is greater than a degree of intensity of the thermal conductive components near the signal contact.

4. The substrate structure as claimed in claim 1, wherein the thermal-dissipating structure further comprises a thermal conductive component and a thermal-dissipating member, and the thermal-dissipating member has a plurality of protruding portions.

5. The substrate structure as claimed in claim 1, further comprising another thermal-dissipating structure, wherein the first surface faces the other thermal-dissipating structure.

6. The substrate structure as claimed in claim 1, further comprising a metal thermal conductive board disposed in the substrate, wherein the metal thermal conductive board is located between the second surface and the thermal-dissipating structure.

7. The substrate structure as claimed in claim 6, wherein the metal thermal conductive board is electrically insulated from the circuit structure.

8. The substrate structure as claimed in claim 1, further comprising a third insulating layer and a metal thermal conductive board, wherein the third insulating layer is located between the second insulating layer and the metal thermal conductive board, and the metal thermal conductive board is in contact with the third insulating layer and the thermal-dissipating structure simultaneously.

9. The substrate structure as claimed in claim 1, further comprising a passive component and an insulating material layer, wherein the passive component is disposed on the first insulating layer, and the insulating material layer is wrapped around the passive component.

10. The substrate structure as claimed in claim 9, wherein a thermal conductivity of the insulating material layer is higher than a thermal conductivity of the first insulating layer or the second insulating layer.

11. The substrate structure as claimed in claim 1, wherein a groove is formed in the second insulating layer and the substrate, and the thermal-dissipating structure is disposed in the groove.

12. The substrate structure as claimed in claim 1, wherein a hardness of the substrate is lower than a hardness of the first insulating layer or the second insulating layer.

13. A substrate structure, comprising:
a substrate;
an integrated circuit chip disposed in the substrate;
a circuit structure electrically connected to the integrated circuit chip;
a thermal-dissipating structure disposed in the substrate and adjacent to the integrated circuit chip, wherein the thermal-dissipating structure is electrically isolated from the circuit structure; and
a metal thermal conductive board disposed on the substrate, wherein the metal thermal conductive board is in contact with the substrate and the thermal-dissipating structure simultaneously.

14. The substrate structure as claimed in claim 13, further comprising a thermal-dissipating member, wherein the metal thermal conductive board is located between the thermal-dissipating structure and the thermal-dissipating member.

15. The substrate structure as claimed in claim 1, wherein the thermal-dissipating structure has a first cross-section and a second cross-section, the first cross-section is located between the integrated circuit chip and the second cross-section, and an area of the first cross-section is smaller than an area of the second cross-section.

16. A substrate structure, comprising:
a substrate;
an integrated circuit chip disposed in the substrate;
a circuit structure electrically connected to the integrated circuit chip; and
a thermal-dissipating structure disposed in the substrate and adjacent to the integrated circuit chip, wherein the thermal-dissipating structure is electrically isolated from the circuit structure, wherein a portion of the substrate is clamped between the thermal-dissipating structure and the integrated circuit chip.

* * * * *